United States Patent [19]

Daubenspeck et al.

[11] Patent Number: 4,836,887

[45] Date of Patent: Jun. 6, 1989

[54] CHLOROFLUOROCARBON ADDITIVES FOR ENHANCING ETCH RATES IN FLUORINATED HALOCARBON/OXIDANT PLASMAS

[75] Inventors: Timothy H. Daubenspeck, Colchester; Faith S. Ichishita, Essex Junction, both of Vt.

[73] Assignee: International Business Machines Corporation, Armonk, N.Y.

[21] Appl. No.: 123,640

[22] Filed: Nov. 23, 1987

[51] Int. Cl.$^4$ .............................. C23F 1/02; C23F 1/12
[52] U.S. Cl. ...................... 156/643; 156/646; 156/656; 156/659.1; 156/664; 252/79.1
[58] Field of Search ............. 156/643, 646, 656, 657, 156/659.1, 662, 664; 252/79.1

[56] References Cited

U.S. PATENT DOCUMENTS

| | | | |
|---|---|---|---|
| 30,505 | 2/1981 | Jacob | 156/643 |
| 31,813 | 10/1980 | Cote et al. | |
| 123,639 | 3/1982 | Daubenspeck | |
| 3,923,568 | 12/1975 | Bersin | 156/643 |
| 3,951,709 | 4/1976 | Jacob | 156/643 |
| 4,026,742 | 5/1977 | Fujino | 156/643 |
| 4,267,013 | 5/1981 | Iida et al. | 156/643 |
| 4,374,698 | 2/1983 | Sanders et al. | 156/643 |
| 4,374,699 | 2/1988 | Sanders et al. | 156/643 |
| 4,447,290 | 5/1984 | Matthews | 156/626 |
| 4,475,982 | 10/1984 | Lai et al. | 156/643 |
| 4,547,261 | 10/1985 | Maa et al. | 156/643 |
| 4,713,141 | 12/1987 | Tsang | 156/643 |
| 4,726,879 | 2/1988 | Bondur et al. | 156/643 |

FOREIGN PATENT DOCUMENTS 56-144541 11/1981 Japan ............................ 156/646

OTHER PUBLICATIONS

Saia et al., "Reactive Ion Etching of Refractory Metals For Gate and Interconnect Applications", Materials Research Soc. 1987.

"Blanket CVD Tungsten Interconnect for VLSI Devices," S. Mehta et al., *1986 Proceedings 3rd International IEEE VLSI Multilevel Interconnection Conf.*, Santa Clara, CA., Jun. 9-10 1986, pp. 418-435.

"Selective Dry Etching of Tungsten for VLSI Metallization," *Journal of the Electrochemical Society: Solid-State Science and Technology,* Oct. 1986, pp. 2113-2118.

"RF Sputter-Etching by Fluoro-Chloro-Hydrocarbon Gases," N. Hosokawa et al., *Japan J. Appl. Phys.*, Suppl. 2, Pt. 1, 1974, p. 435.

*Primary Examiner*—David L. Lacey
*Assistant Examiner*—Andrew J. Anderson
*Attorney, Agent, or Firm*—Mark F. Chadurjian

[57] ABSTRACT

A plasma comprised of a fluorinated gas, an oxidant, and up to 15%-20% chlorofluorocarbon gas etches non-insulating materials such as tungsten and silicon at very high etch rates while providing enhanced etch rate ratios to photoresist and insulators.

7 Claims, No Drawings

CHLOROFLUOROCARBON ADDITIVES FOR ENHANCING ETCH RATES IN FLUORINATED HALOCARBON/OXIDANT PLASMAS

CROSS-REFERENCE TO RELATED APPLICATIONS

Reference is made to co-pending U.S. patent application Ser. No. 031,813, now U.S. Pat. No. 4,786,360 entitled "Anisotropic Etch Process for Tungsten Metallurgy," filed Mar. 30, 1987 by Cote et al and assigned to the assignee of the present invention. The application relates to a $Cl_2/O_2$ chemistry ($O_2=25\%-45\%$ of the mixture by flow rate) that anisotropically etches tungsten-based metallurgies at high etch rates and high etch rate ratios to underlaying dielectric layers.

Reference is also made to co-pending U.S. patent application Ser. No. 123,639, entitled "Chlorofluorocarbon Chemistry For Plasma Etching," filed Nov. 23, 1987 by T. Daubenspeck and assigned to the assignee of the present invention. The application relates to a $CF_3Cl/O_2$ chemistry ($O_2 \geq 50\%$ of the mixture) that provides etch rates and etch rate ratios to photoresist that are far better than those provided by $CF_4/O_2$ discharges.

1. Technical Field

The invention relates to a plasma chemistry that is useful for etching various materials.

2. Background Art

Plasma etching has replaced wet etching as the method of choice for delineating patterns within the various layers that form integrated circuits. In general, plasmas provide higher etch rates, greater anisotropy (i.e., more vertical profiles), and lower foreign material concentrations as compared to wet etchants. In plasma etching, a gas (or a combination of gases) is ionized to form a plasma. Depending on the conditions of the system (e.g., pressure, power, bias to the electrodes, etc.) as well as the nature of the ions, the exposed material can be etched in a "physical" mode, a "chemical" mode, or a mode that is both physical and chemical. In the physical etch mode, the ions are inert with respect to the exposed material, and they have sufficient energy to physically dislodge atoms from the exposed surface. In the chemical mode, the ions do chemically react with the exposed surface to form gaseous reaction products that are pumped away. In reactive ion etching (RIE) both physical and chemical etching takes place. That is, while the ions chemically react with the surface, they have sufficient energy to enhance the rate of reaction as a function of the angle between the exposed surface and the direction of ion bombardment.

Various combinations of gases have been disclosed for producing these plasmas. Prominent among these combinations have been those that include the halogen gases, particularly chlorine and fluorine. These gases produce ions that readily react with exposed surfaces, enhancing the rate of formation of volatile reaction products.

U.S. Pat. No. Re. 30,505, entitled "Process and Material for Manufacturing Semiconductor Devices," originally filed May 12, 1972 by Jacob, reissued Feb. 3, 1981, and assigned to LFE Corporation, relates to a binary mixture of $CF_4/O_2$ for etching silicon oxide, silicon nitride, tungsten, and molybdenum. The patent also discloses the use of $CHF_3/O_2$ and $C_2F_3Cl_3/O_2$ ($O_2=75\%$ of the total gas mixture) to etch silicon oxide. The patent teaches that $O_2$ concentrations up to 25% are preferred, in that at higher $O_2$ percentages the overlaying photoresist masking layer will be appreciably etched.

U.S. Pat. No. 3,951,709, entitled "Process and Material for Semiconductor Photomask Fabrication," filed 2/28/74 by Jacob, issued Apr. 20, 1976, and assigned to the LFE Corporation discloses a plurality of binary plasma chemistries (i.e., organic chlorine compounds mixed with oxygen, inorganic chlorine compounds mixed with oxygen) that are useful to etch chromium or gold metallurgies. Among these etch compositions is a binary mixture of chlorine gas and oxygen, wherein oxygen comprises between 40-80% of the mixture. $CFCl_3$ is cited as one of the possible organic chlorine compounds that can be used.

As shown by the above-cited patents, chlorofluorocarbons molecules (i.e., molecules in which carbon atoms are linked to both fluorine and chlorine atoms) have been used as plasma components. More specifically, chlorofluorocarbons acting alone have been used to generate plasmas that etch various materials. See U.S. Pat. No. 4,026,742 ($CCl_2F_2$ in an inert carrier gas is used to etch metals such as tungsten and molybdenum by converting them into metal fluorides that are subsequently removed by wet etching); U.S. Pat. No. 4,353,777 (experiments using $CF_3Cl$, $CF_2Cl_2$, and $CFCl_3$ plasmas to etch polysilicon established $CFCl_3$ having the highest average etch rate ratio to an underlaying glass layer at chamber pressures of 50-150 mTorr and power densities of 0.24-1.96 $W/cm^2$); U.S. Pat. No. 4,473,436 ($CCl2F2$ or $CFCl_3$ is used with an inert carrier gas to etch a composite of polysilicon and metal silicide with an $SF_6/Cl_2$ combination being preferred); U.S. Pat. No. 4,405,406 ($CHCl_2F$ is used to etch polysilicon at a high etch ratio to photoresist rate at chamber pressures of 150-400 mTorr and power densities of 0.1-0.4 $W/cm^2$); and an article by Hosokawa et al, entitled "RF Sputter-Etching by Fluoro-Chloro-Hydrocarbon Gases," *Japan J. Appl. Phys.*, Suppl. 2, Pt. 1, 1974, p. 435 (chlorofluorocarbons such as $CFCl_3$ and $CCl_2F_2$ are used to etch silicon at 20 mTorr and 1.3 $W/cm^2$, to provide an etch rate of 1670 Å/mn and 220 Å/mn, respectively. The etch rae of molybdenum in $CCl_2F_2$ is 836 Å/mn).

Moreover, as shown in the above-cited LFE patents, chlorofluorocarbons have also been used in various binary combinations with oxygen or other active additives. See an article by Burba et al, entitled "Selective Dry Etching of Tungsten for VLSI Metallization," *Journal of the Electrochemical Society: Solid State Science and Technology*, Oct. 1986, pages 2113-2118, (tungsten is etched in $C_4/O_2/$ He and $CBrF_3/O_2/He$ plasmas. In the $CClF_3/O_2/He$ chemistry, the tungsten etch rate increased as the oxygen concentration rose from zero to 15 percent, above which the etch rate appears to level off at approximately 275 Å/mn in a single wafer tool having a radio frequency (RF) excited plasma at a power density of 0.22 $W/cm^2$ and a pressure of 160 mTorr. The etch rate of $SiO_2$ stayed relatively constant). See also U.S. Pat. No. 4,314,875 (the etch rate of a material such as photoresist in halocarbon plasmas such as $CF_2Cl_2$ and $CF_3Cl$ that normally produce unsaturated by-products is enhanced by the 20% addition of an oxidant such as $O_2$, $NF_3$, etc. that combines with the unsaturated by-products and removes them from the reaction); U.S. Pat. No. 4,374,699 (addition at least 25% $CO_2$ or NO to a $CF_3Cl$ plasma to enhance the removal of photoresist relative to polysilicon); and U.S. Pat. No. 3,923,568 (etching gold, platinum, palladium, or silver in $CCl_2F_2$ with not more than 25% oxygen to retard photoresist removal while enhancing etch rate).

Finally, various ternary compositions (consisting of a chlorofluorocarbon, a halogen, and an oxidant material) have been proposed for etching various materials. In U.S. Pat. No. 4,267,013, aluminum is patterned in a plasma comprised of boron trichloride, oxygen, and a halocarbon such as $CCl_2F_2$. The halocarbon constitutes between 10% and 32% of the total mixture. The halocarbon enhances the etch rate of aluminum in $BCl_3$. In U.S. Pat. No. 4,547,261, aluminum is patterned in a plasma comprised of boron trichloride, nitrogen, and a chlorofluorocarbon. The chlorofluorocarbon constitutes between 8% and 50%, preferably between 12% and 40%, of the mixture. The chlorofluorocarbon is added to passivate the sidewalls of the reactive chamber during the etch, thus minimizing contaminants. In U.S. Pat. No. 4,374,698, layers of silicon oxide and silicon nitride are etched in a $CF_4+O_2$ plasma having 1%–15% $CF_3Br$ or $CCl_2F_2$. The latter gases retard the etch rate of silicon oxide much more than they retard the etch rate of silicon nitride, thus enhancing the etch selectively between the two layers. Finally, an article by Metha e al, entitled "Blanket CVD Tungsten Interconnect for VLSI Devices," 1986 *Proceedings 3rd International IEEE VLSI Multilevel Interconnection Conference*, Santa Clara, California, June 9–10, 1986, pages 418–435, discloses the use of ternary plasma gas chemistry comprised of $SF_6$/ CCl /$O_2$ to anisotropically etch CVD tungsten. The authors noted that $SF_6$ alone produced poor etch anisotropy, which was remedied by adding $CCl_4$. Oxygen was added in order to enhance the etch selectivity to the underlaying P-doped glass.

Currently, fluorine-based chemistries are used to etch semiconductors and conductors such as tungsten. These chemistries present a high etch rate selectivity to photoresist. However, these fluorine-based chemistries do not provide high etch rates without substantially increasing the energy of the plasma. Increasing the energy of the plasma makes the process more expensive to run while decreasing the etch selectivity to photoresist. While chlorine-based chemistries prvvide higher etch rates at conventional power densities, they provide a reduced etch selectivity to photoresist.

Accordingly, there is a need in the art for a gaseous plasma that provides both high etch rates and high etch rate ratios to photoresist.

SUMMARY OF THE INVENTION

The invention provides a gaseous plasma that removes non-insulating materials such as silicon and tungsten at high etch rates while also achieving etch rate ratios to photoresist that are greater than unity. The plasma is made up of a fluorinated halocarbon, an oxidant agent, and 5%–15% chlorofluorocarbon. Studies have shown that the added chlorofluorocarbon appreciably enhances the etch rate of non-insulating materials over a broad range of fluorinated halocarbon/oxygen percentages.

DESCRIPTION OF THE BEST MODE FOR CARRYING OUT THE INVENTION

The inventors have found that the addition of a chlorofluorocarbon to a $CF_4/O_2$ or $CHF_3/O_2$ gaseous plasma greatly enhances the etch rates (ER) of films such as tungsten and silicon, while also enhancing their etch rate ratios to photoresist (ERR-P) as well as other insulating materials such as doped silicon oxide. Apparently the additional chlorofluorocarbon provides a critical proportion of chlorine, fluorine, and oxidant species that greatly nhance the generation and/or utilization rate of tungsten or silicon halogen-based reactive species relative to the generation and/or utilization rate of polymeric reaction species.

All experiments were carried out on a commercially available multi-wafer etch tool (i.e. a Plasmatherm PK24 batch reactor having two 20.5 in. diameter parallel aluminum plates separated by a distance of 7 cm). The upper electrode was coated with a layer of photoresist to minimize aluminum sputtering. The photoresist was a phenol-formaldehyde resin having a diazonaphthoquinone sensitizer, as generally described in U.S. Pat. No. 3,201,239. The chamber was conditioned to carry out the etches in a reactive ion etch (RIE) mode, wherein the substrate electrode is powered and the chamber pressure is maintained at 55 mTorr. The tool power was set at 300 W. The total gas inlet flow was maintained at 120 SCCM. All runs involved etching a single blank four inch wafer located next to a view port at one of eleven wafer locations within the reactor. Optical emission spectra were collected at the view port adjacent to the test wafer for all runs. Tungsten blanks were prepared by deposition of 2 micron films on silicon using a commercially available chemical vapor deposition (CVD) reactor. Two micron thick films of photoresist were prepared and etched for rate measurement and selectivity calculation. Substrate temperature was held at 20°–25° C. for all runs and was monitored directly using a fluoroptic probe contacting the underside of the etching wafer. Tungsten etch rates were obtained gravimetrically and converted to units of length/time using the CVD tungsten film density (25 g/cm$^3$) and the wafer area. Photoresist etch rates were determined directly by optical measurement.

The results of the experiments are shown in Tables 1–4 below. The relative amounts of the chlorofluorocarbon gas, the fluorinated halocarbon, and oxygen are given in terms of percentage of the total gas flow. For example, for a plasma comprised of 64% $CF_4$, 31% $O_2$, and 5% $CCl_2F_2$, the $CCl_2F_2$ flow rate would be $0.05 \times (120) = 6$ SCCM, the $CF_4$ flow rate would be $0.64 \times (120) = 77$ SCCM, and $O_2$ flow would be $0.31 \times (120) = 37$ SCCM.

Table 1 shows the results of tungsten etching in various $CF_4/O_2$ discharges having varying additions of $CCl_2F_2$:

TABLE 1

| RUN | $CF_4$ % | $O_2$ % | $CCl_2F_2$ % | W ETCH RATE, A/MN | W: PHOTO ERR |
|---|---|---|---|---|---|
| A1 | 33 | 67 | 0 | 100 | <0.10 |
| A2 | 31 | 64 | 5 | 1100 | 1.05 |
| A3 | 30 | 60 | 10 | 1100 | 1.75 |
| A4 | 29 | 56 | 15 | 750 | 1.50 |
| A5 | 24 | 46 | 30 | 100 | 0.60 |
| B1 | 67 | 33 | 0 | 500 | 0.65 |
| B2 | 64 | 31 | 5 | 1080 | 2.40 |
| B3 | 60 | 30 | 10 | 830 | 2.08 |
| B4 | 56 | 29 | 15 | 440 | 1.35 |
| B5 | 46 | 24 | 30 | 90 | 0.55 |
| C1 | 95 | 0 | 5 | 170 | 0.52 |
| C2 | 76 | 19 | 5 | 950 | 2.40 |
| C3 | 57 | 38 | 5 | 1170 | 1.35 |
| C4 | 19 | 76 | 5 | 690 | 0.62 |
| C5 | 0 | 95 | 5 | 0 | — |
| D1 | 90 | 0 | 10 | 100 | 0.47 |

TABLE 1-continued

| RUN | CF$_4$ % | O$_2$ % | CCl$_2$F$_2$ % | W ETCH RATE, Å/MN | W: PHOTO ERR |
|---|---|---|---|---|---|
| D2 | 72 | 18 | 10 | 660 | 1.83 |
| D3 | 18 | 72 | 10 | 820 | 0.98 |
| D4 | 0 | 90 | 10 | 0 | — |
| E1 | 100 | 0 | 0 | 70 | 0.35 |
| E2 | 80 | 20 | 0 | 360 | 0.87 |
| E3 | 70 | 30 | 0 | 500 | 0.60 |
| E4 | 60 | 40 | 0 | 380 | 0.50 |
| E5 | 40 | 60 | 0 | 120 | 0.10 |
| E6 | 20 | 80 | 0 | 60 | 0.05 |
| E7 | 0 | 100 | 0 | 0 | — |
| F1 | 0 | 20 | 80 | 50 | — |
| F2 | 0 | 40 | 60 | 110 | — |
| F3 | 0 | 60 | 40 | 140 | — |
| F4 | 0 | 80 | 20 | 80 | — |
| F5 | 0 | 100 | 0 | 0 | — |

In general, the experiments show that as the CCl$_2$F$_2$ percentage increases from zero to five-fifteen percent, both the tungsten etch rate and the tungsten:photoresist etch rate ratios are greatly enhanced as compared to CF$_4$/O$_2$ alone. Both the ER and ERR decrease as the CCl$_2$F$_2$ percentage increases above 15%–20%. See the ER and ERR of runs A and B as compared to run E. As the percentage of oxygen increases, the peak etch rate is achieved at higher percent chlorofluorocarbon additions (peak etch rate for O$_2$=33% was achieved at 5% CCl$_2$F$_2$; peak etch rate for O$_2$=66% was achieved at 10%–15% CCl$_2$F$_2$). However, note also that as the percentage of oxygen increases, the etch rate ratio to photoresist decreases (compare the change in the ERR-P for runs A2–A3 with those of runs B2–B3). This is because the additional oxygen enhances the photoresist etch rate. In general, the addition of CCl$_2$F$_2$ greatly enhanced by more than 2× the etch rate over the useful range (CF$_4$=20%–80%) of C mixtures. Compare the etch rates for runs C (5% CCl$_2$F$_2$) and D (10% CCl$_2$F$_2$) with those of run E. In addition, if a tungsten:resist selectivity of 1:1 is considered an acceptable threshold value, it can be seen that the addition of 5% and 10% CF$_2$Cl$_2$ expands the useful range of the CF$_4$/O$_2$ chemistry from a range of zero to a range of 5%–85% O$_2$. Finally, note that a binary mixture of CCl$_2$F$_2$/O$_2$ was carried out (run F), showing that the mere presence of chlorine, fluorine, and oxygen radicals do not produce the results of the invention. These results are consistent with those reported in the Mehta et al and Burba et al articles (i.e., greatly increased tungsten etch rates not observed in an SF$_6$/ CCl$_4$/O$_2$ plasma). Moreover, the inventors could not replicate the results provided here by adding Cl$_2$ to a CF$_4$/O$_2$ mixture on a consistent basis. That is, runs under the same flow rate ratio conditions produced greatly varying etch rates. The utilization of freons in tungsten etching offers a non-toxic method relative to a process which would employ chlorine.

Table 2 shows the results achieved by substituting CF$_3$Cl for CCl$_2$F$_2$ as an additive in a CF$_4$/O$_2$ tungsten etch:

TABLE 2

| RUN | CF$_4$ % | O$_2$ % | CF$_3$Cl % | W ER, Å/MN |
|---|---|---|---|---|
| G1 | 33 | 67 | 0 | 30 |
| G2 | 31 | 64 | 5 | 660 |
| G3 | 30 | 60 | 10 | 1170 |
| G4 | 29 | 56 | 15 | 1260 |
| G5 | 24 | 46 | 30 | 840 |
| H1 | 67 | 33 | 0 | 250 |

TABLE 2-continued

| RUN | CF$_4$ % | O$_2$ % | CF$_3$Cl % | W ER, Å/MN |
|---|---|---|---|---|
| H2 | 64 | 31 | 5 | 1090 |
| H3 | 60 | 30 | 10 | 1100 |
| H4 | 56 | 29 | 15 | 1060 |
| H5 | 53 | 27 | 20 | 910 |
| H6 | 46 | 24 | 30 | 540 |

Table 2 shows that the CF$_3$Cl additive provides the same general properties as CCl$_2$F$_2$ additive. That is, a small addition of chlorofluorocarbon appreciably enhances the etch rate of tungsten. Similarly to the CCl$_2$F$_2$ additive, the peak etch rates at CF$_4$=66% of the total mixture were higher than those at CF$_4$=33% (compare the etch rates of runs G3–G4 with those of runs H2–H4). However, at higher oxygen percentages the peak etch rates achieved by CF$_3$Cl stayed relatively constant over a far greater range of chlorofluorocarbon additions (5%–20%) than those achieved in the CCl$_2$F$_2$ case (5%–10%), and etch rate enhancement for CF$_3$Cl was still observed at 30% additions. The etch rates achieved by CF$_3$Cl were greater than those achieved by CCl$_2$F$_2$, particularly at higher CF$_3$Cl percentage additions. While etch rate ratio data was not recorded for the CF$_3$Cl case, it is postulated that the increased etch rate of tungsten would not extend to photoresist, such that the etch rate ratios should increase as compared to those observed for CCl$_2$F$_2$, particularly at lower CF$_3$Cl percentages. The etch rate enhancement at low CF$_3$Cl additions is strikingly similar to that achieved by CCl$_2$F$_2$. Combined with the previous observations regarding Cl$_2$/CF$_4$/O$_2$ and CCl$_2$F$_2$/O$_2$ plasmas, the above-noted results confirm the importance of using a chlorofluorocarbon as the chlorine source in the ternary plasmas of the invention.

Table 3 shows the results of etching in a CHF$_3$/O$_2$ plasma having additional CCl$_2$F$_2$.

TABLE 3

| RUN | CHF$_3$ % | O$_2$ % | CCl$_2$F$_2$ % | W ER Å/MN | ERR-P |
|---|---|---|---|---|---|
| I1 | 25 | 75 | 0 | 310 | 0.32 |
| I2 | 24 | 71 | 5 | 670 | 0.90 |
| I3 | 22 | 68 | 10 | 620 | 1.15 |
| I4 | 21 | 64 | 15 | 380 | 0.93 |
| J1 | 33 | 67 | 0 | 250 | 0.42 |
| J2 | 31 | 64 | 5 | 580 | 1.17 |
| J3 | 30 | 60 | 10 | 370 | 0.87 |
| J4 | 29 | 56 | 15 | 320 | 0.62 |
| K1 | 67 | 33 | 0 | 80 | 0.30 |
| K2 | 64 | 31 | 5 | 160 | 0.61 |
| K3 | 60 | 30 | 10 | 170 | 0.61 |
| K4 | 56 | 29 | 15 | 100 | 0.47 |
| L1 | 95 | 0 | 5 | 10 | 0.22 |
| L2 | 76 | 19 | 5 | 95 | 0.48 |
| L3 | 57 | 38 | 5 | 210 | 0.62 |
| L4 | 38 | 57 | 5 | 440 | 1.11 |
| L5 | 28 | 66 | 5 | 680 | 1.31 |
| L6 | 19 | 76 | 5 | 660 | 0.97 |
| M1 | 100 | 0 | 0 | 0 | <0.01 |
| M2 | 80 | 20 | 0 | 20 | 0.17 |
| M3 | 60 | 40 | 0 | 80 | 0.28 |
| M4 | 40 | 60 | 0 | 120 | 0.45 |
| M5 | 30 | 70 | 0 | 260 | 0.35 |
| M6 | 20 | 80 | 0 | 310 | 0.33 |

The above results show that the etch rate enhancement is much smaller when CHF$_3$ is used instead of CF$_4$. This may be due to several factors. The CHF$_3$ gas provides less fluorine than the CF$_4$ gas. This may push the composite mixture towards one end of the C—

Cl—F range that provides the etch rate enhancement. Moreover, the presence of CH° radicals retard tungsten etch rates by polymer formation. However, even though it is less pronounced, the etch rate enhancement is still appreciable. Over the entire range of $CHF_3/O_2$ percentages, a 5% $CCl_2F_2$ additive consistently provided etch rates at least twice as high (and etch rate ratios twice to three times as high) as those provided in the absence of $CCl_2F_2$ (compare the etch rate results of runs L with those of runs M). However, because the etch rates were lower, an acceptable etch rate ratio to photoresist was provided over a smaller range of $CCl_2F_2$ additives to $CHF_3/O_2$ as compared with $CF_4/O_2$. Specifically, ERRs greater than unity were only achieved when the $CHF_3$ percentage was approximately 20%–50% and the $CCl_2F_2$ percentage was approximately 5% (or 5%–10% when the $CHF_3$% was at the low end of the range). Compare this to the broad range of parameters in Table 1 that yielded ERRs of greater than unity.

The $CHF_3$ gas is known to provide polymerization of the sidewalls during etching, resulting in anisotropic profiles. Because the inventors were unsure what effect the enhanced etch rates of the invention would have on the etched profiles, several test wafers having 0.7 μm—thick layers of tungsten were etched and examined by scanning electron microscope. The examination confirmed that while tungsten etched in $CF_4/O_2/CCl_2F_2$ exhibited isotropic profiles, tungsten etched in $CHF_3/O_2/CCl_2F_2$ exhibited anisotropic profiles. The anisotropic nature of the profiles was shown to be maximized when the power was raised from 300 W to 500 W, the pressure was lowered from 55 mTorr to 30 mTorr, and the total gas flow was lowered from 120 SCCM to 30 SCCM. In general, these changes to the etch parameters would be expected to maximize the physical component of the etch, and hence would also be expected to enhance both etch rates and etch anisotropy. One would expect the etch rate enhancement to be commensurate for the $CHF_3/O_2$ and $CHF_3/O_2/CCl_2F_2$ cases, such that the etch rate ratio between the two would remain relatively constant. However, while the 0.7 μm layer of tungsten was completely etched in nine minutes in a 40% $CHF_3$/53% $O_2$/7% $CCl_2F_2$ plasma, only approximately 0.2 μm of the tungsten was etched in 18 minutes in a 40% $CHF_3$/60% $O_2$ plasma. This 6:1 etch rate ratio is almost two times greater than the ratio observed under conventional conditions (compare the tungsten etch rate of run L4 to that of run M4). Moreover, the photoresist:tungsten etch rate ratio remained on the order of unity. In general, these results indicate that the etch rate enhancements produced by the invention as shown in Tables 1–3 would be further enhanced as the physical etching component of the plasma is increased. Moreover, the results confirm that the invention does not appreciably affect the profiles normally expected in $CF_4/O_2$ and $CHF_3/O_2$ etches.

Table 4 shows the results of experiments in which varying $CF_4/O_2/CCl_2F_2$ chemistries were used to etch silicon:

TABLE 4

| RUN | $CF_4$ % | $O_2$ % | $CCl_2F_2$ % | Si ER, Å/MN | ERR-P |
| --- | --- | --- | --- | --- | --- |
| N1 | 76 | 19 | 5 | 1750 | 4.0 |
| N2 | 66 | 29 | 5 | 2000 | |
| N3 | 57 | 38 | 5 | 1900 | 2.5 |
| N4 | 38 | 57 | 5 | 500 | 1.0 |
| N5 | 19 | 76 | 5 | 200 | <0.1 |
| O1 | 100 | 0 | 0 | 200 | 0.9 |
| O2 | 90 | 10 | 0 | 700 | 2.0 |
| O3 | 80 | 20 | 0 | 400 | 1.0 |
| O4 | 70 | 30 | 0 | 350 | 0.5 |
| O5 | 60 | 40 | 0 | 250 | 0.5 |
| O6 | 40 | 60 | 0 | 150 | 0.2 |
| O7 | 20 | 80 | 0 | 100 | <0.1 |

The experimental results shown in Table 4 generally establish that the etch rate enhancement provided by chlorofluorocarbon additions to $CF_4/O_2$ or $CHF_3/O_2$ tungsten etchants is also produced when etching silicon. The above results were produced by etching single crystal silicon under the same conditions used to etch tungsten. Note the 3× improvement in peak etch rate and the 2× improvement in selectivity to photoresist, provided by the 5% $CCl_2F_2$ additive as compared to silicon etching without the inclusion of $CF_2Cl_2$. Moreover, additional experiments showed that under the conditions in runs N1, N2 and N3, the silicon:silicon oxide etch rate ratio was 9.5:1, 12:1, and 9.0:1, respectively. Compare this to the silicon:$SiO_2$ etch rate ratios of runs O3 and O5 (2.1:1 and 1.1:1, respectively). In other words, the 3× improvement in etch rate was accompanied by an even greater improvement in the silicon:$SiO_2$ etch rate ratio, on the order of 5 or 6 to 1. While all of runs N were carried out with a 5% $CCl_2F_2$ additive, the similarities to the etch rate enhancements observed with 5% $CCl_2F_2$ additives in the tungsten etch would suggest that higher percentages of the $CCl_2F_2$ additive would produce results similar to those observed when etching tungsten.

While a 60% oxygen formulation of $CF_4/O_2$/5% $CF_2Cl_2$ would not be expected to provide anisotropic profiles, it was discovered that fully anisotropic profiles could be generated in a 3000 Å silicon film in a time of 1.5 minutes, for an etch rate of 2000 Å/mn. These results were achieved in a load locked Applied Materials AME 8330 Latch reactor at a condition of 400 Watts, 20 mTorr, 45 SCCM total flow, and a dc-bias of 150 volts. Moreover, the etch displayed a remarkable selectivity to the underlying gate oxide removing only 25 Å during a full 100% overetch.

The above experimental observations show that for different fluorinated halocarbons ($CF_4$, $CHF_3$) and different chlorofluorocarbon additives ($CCl_2F_2$, $CF_3Cl$), the etch rate of both conductive materials such as tungsten and semiconductive materials such as silicon that are normally etched in such fluorinated halocarbons can be markedly increased. This increase in etch rate is generally more pronounced at lower percentage chlorofluorocarbon additions (i.e., 1%–10%). While the invention has been demonstrated with reference to $CCl_2F_2$ and $CF_3Cl$ additives, other chlorofluorocarbons that would provide additional dissociated halogen and sub-saturated halo-carbon species could be used. In addition to the potential importance of relative levels of the active halogen involved in the etch reaction, there is some evidence for possible participation by free-radical $CFx$ species in the reduction of the surface presence of non-volatile tungsten oxide. Erratic results obtained with $CF_4/Cl_2$ and $O_2$ with aged tungsten wafers support this theory when compared with the consistency of performance of the disclosed chemistries with surfaces of all ages. Moreover, while the present invention has been described with reference to $CF_4$ and $CHF_3$, other fluorine-based halocarbons (e.g., $C_2F_6$, $C_3F_8$, etc.) as well as other fluorine-based gases (e.g., $SF_6$) could be used. In addition to oxygen, supply atomic oxygen to the reaction could be used. The plasma of the invention could be used to etch other materials that have tungsten and/or silicon as their major component (e.g., tungsten silicide) as well as other refractory metals (e.g., titanium) that form high volatility reaction products in both chlorine-based and fluorine-based plasmas.

We claim:

1. A process for etching a refractory metal layer at a rate faster than that of either a polymer layer or an insulator layer, comprising the step of exposing the layers to a gaseous plasma comprising an oxidant gas, a fluorine-based halocarbon gas selected from the group consisting of $CF_4$ and $CHF_3$, and up to approximately 20% of chlorofluorocarbon gas, said chlorofluorocarbon gas being present in an amount sufficient to enhance the refractory metal etch rate, and said fluorine-based halocarbon gas being present in an amount greater than that of said chlorofluorocarbon gas.

2. In a process for etching tungsten, in a $CF_4/O_2$ plasma, the addition of approximately 5%-20% chlorofluorocarbon gas to said plasma to enhance the tungsten etch rate, wherein the amount of $CF_4$ is greater than that of said chlorofluorocarbon gas.

3. The method as recited in claim 2, wherein said chlorofluorocarbon is selected from the group consisting of $CCl_2F_2$ and $CF_3Cl$.

4. The method as recited in claim 3, wherein said plasma is generated in a chamber having a pressure of approximately 55 mTorr and a power of 300 1 W.

5. In a process for etching tungsten, in a $CHF_3/O_2$ plasma, the addition of approxmately 1%-10% chlorofluorocarbon gas to said plasma to enhance the tungsten etch rate, wherein the amount of $CHF_3$ is greater than that of said chlorofluorocarbon gas.

6. The method as recited in claim 5, wherein said chlorofluorocarbon is selected from the group consisting of $CCl_2F_2$ and $CF_3Cl$.

7. The method as recited in claim 6, wherein said plasma is generated in a chamber having a pressure of approximately 55 mTorr and a power of 300 W.

* * * * *